US010769692B2

(12) United States Patent
Davies et al.

(10) Patent No.: US 10,769,692 B2
(45) Date of Patent: Sep. 8, 2020

(54) SECURITY INSTALLATION AND MAINTENANCE SYSTEM

(71) Applicant: Overview Technologies, Inc., Encino, CA (US)

(72) Inventors: Christopher Paul Davies, Perth (AU); Scott Anthony Rhodes, Perth (AU)

(73) Assignee: Overview Technologies, Inc., Encino, CA (US)

( * ) Notice: Subject to any disclaimer, the term of this patent is extended or adjusted under 35 U.S.C. 154(b) by 210 days.

(21) Appl. No.: 15/744,992

(22) PCT Filed: May 3, 2016

(86) PCT No.: PCT/US2016/030584
§ 371 (c)(1),
(2) Date: Jan. 15, 2018

(87) PCT Pub. No.: WO2017/011060
PCT Pub. Date: Jan. 19, 2017

(65) Prior Publication Data
US 2018/0211301 A1    Jul. 26, 2018

Related U.S. Application Data

(63) Continuation-in-part of application No. PCT/US2016/013415, filed on Jan. 14, 2016, and a
(Continued)

(51) Int. Cl.
*G06Q 30/06* (2012.01)
*G08B 13/00* (2006.01)
(Continued)

(52) U.S. Cl.
CPC ....... *G06Q 30/0621* (2013.01); *G06Q 50/265* (2013.01); *G08B 13/00* (2013.01); *G06F 30/00* (2020.01); *G08B 25/00* (2013.01)

(58) Field of Classification Search
None
See application file for complete search history.

(56) References Cited

U.S. PATENT DOCUMENTS

| 7,161,481 B2 * | 1/2007 | Turner | G06Q 10/10 340/506 |
| 7,221,267 B2 * | 5/2007 | Chalker | G06F 9/453 340/539.1 |

(Continued)

FOREIGN PATENT DOCUMENTS

| JP | 2008242745 A | 10/2008 |
| JP | 2008305038 A | 12/2008 |
| JP | 2010152677 A | 7/2010 |

OTHER PUBLICATIONS

Installation Instructions for the AE20 Universal Enclosure, 2004 Bosch Security Systems. (Year: 2004).*

(Continued)

*Primary Examiner* — Nicholas D Rosen
(74) *Attorney, Agent, or Firm* — Avyno Law P.C.

(57) ABSTRACT

A system is provided that includes a computer implemented method for the automated purchasing of a security system having a plurality of security equipment components for use and installation on a unique geo-coordinate referenced location (i.e., a property). The system also includes a computer implemented method for installing the security equipment on the property that was purchased using the automated purchasing system.

6 Claims, 8 Drawing Sheets

Related U.S. Application Data continuation-in-part of application No. PCT/US2015/040421, filed on Jul. 14, 2015.

(51) Int. Cl.
*G06Q 50/26* (2012.01)
*G08B 25/00* (2006.01)
*G06F 30/00* (2020.01)

(56) References Cited

U.S. PATENT DOCUMENTS

| | | | |
|---|---|---|---|
| 8,346,624 B2* | 1/2013 | Goad | G06Q 30/02 705/26.1 |
| 8,626,616 B2* | 1/2014 | Eich | G06F 17/50 705/28 |
| 8,655,593 B1* | 2/2014 | Davidson | G08G 1/0112 188/79.54 |
| 9,347,789 B2* | 5/2016 | Briant | G06F 16/9537 |
| 9,398,413 B1* | 7/2016 | Scalise | H04W 4/023 |
| 10,073,929 B2* | 9/2018 | Vaynriber | G06F 17/5004 |
| 10,242,561 B1* | 3/2019 | Davies | G08B 13/19 |
| 10,380,877 B2* | 8/2019 | Davies | H04N 7/181 |
| 2003/0023411 A1* | 1/2003 | Witmer | G06F 17/50 703/1 |
| 2005/0125118 A1* | 6/2005 | Chalker | G06F 9/453 340/539.1 |
| 2005/0285730 A1* | 12/2005 | Turner | G06Q 10/10 340/514 |
| 2006/0201964 A1 | 9/2006 | DiPerna et al. | |
| 2006/0271952 A1 | 11/2006 | Gurley et al. | |
| 2007/0096902 A1 | 5/2007 | Seeley et al. | |
| 2007/0109115 A1* | 5/2007 | Kiani | A61B 5/1455 340/507 |
| 2007/0152807 A1 | 7/2007 | Huang et al. | |
| 2007/0256105 A1* | 11/2007 | Tabe | G08B 13/19697 725/78 |
| 2010/0124900 A1* | 5/2010 | Lui | H04M 1/72541 455/404.2 |
| 2011/0111728 A1 | 5/2011 | Ferguson et al. | |
| 2011/0137818 A1* | 6/2011 | Goad | G06Q 30/02 705/347 |
| 2011/0246338 A1* | 10/2011 | Eich | G06F 17/50 705/28 |
| 2011/0319051 A1 | 12/2011 | Reitnour | |
| 2012/0092161 A1 | 4/2012 | West | |
| 2012/0225635 A1 | 9/2012 | Esbensen | |
| 2012/0252399 A1 | 10/2012 | Saito et al. | |
| 2013/0183924 A1 | 7/2013 | Saigh et al. | |
| 2014/0071274 A1 | 3/2014 | Golden | |
| 2014/0136379 A1* | 5/2014 | Smith | G06Q 30/04 705/34 |
| 2014/0149032 A1* | 5/2014 | Barrett | G01C 21/32 701/409 |
| 2014/0278281 A1 | 9/2014 | Vaynriber et al. | |
| 2015/0081207 A1* | 3/2015 | Briant | G06F 16/9537 701/410 |
| 2016/0012639 A1* | 1/2016 | Park | G06F 16/5866 345/633 |
| 2017/0103644 A1* | 4/2017 | Chauhan | G06F 3/04817 |
| 2018/0096569 A1* | 4/2018 | Eaton | G08B 15/002 |
| 2020/0105123 A1* | 4/2020 | Davies | G06Q 30/0601 |

OTHER PUBLICATIONS

Kessinger, G., "Hotel/Motel Fire Alarms and Detection," Security Dealer and Integrator, 35.10: 20,84. SouthComm Business Media LLC, Oct. 2013. (Year: 2013).*

* cited by examiner

Customer Record
502

504

- Site Name
- GPS Location
- Address
- Group/Community Memberships
- System Status
- Configuration/Setup parameters
- Application Registrations
- Current Site internet protocol (IP) address
- Event Logs
- Action Logs
- Communication/Chat History
- User Access Security
  + user name
  + password
  + IP Address Record Change History
506

FIG. 5

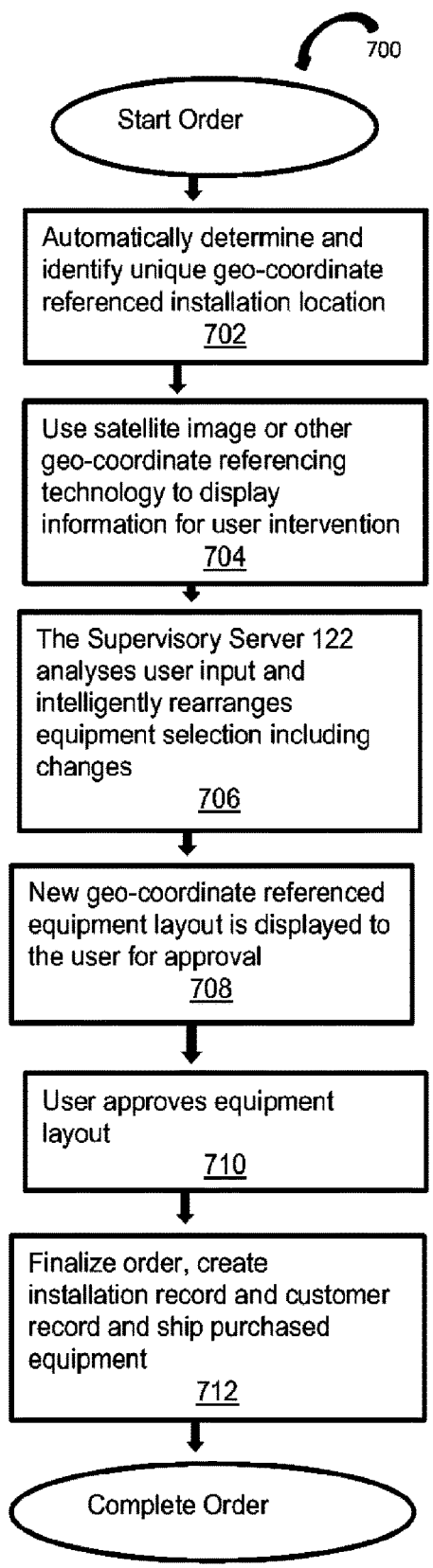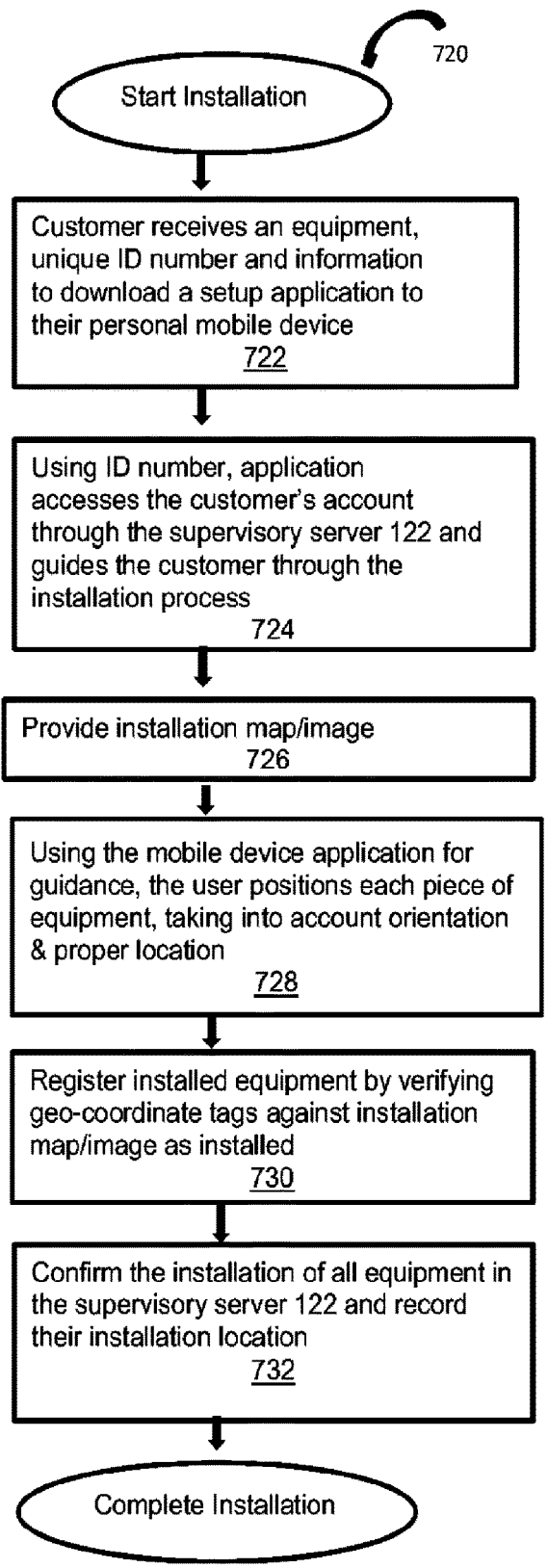
FIG. 7a
FIG. 7b

SECURITY INSTALLATION AND MAINTENANCE SYSTEM

CROSS-REFERENCE TO RELATED APPLICATIONS

This application is a continuation-in-part of International Application PCT/US16/13415 filed Jan. 14, 2016 titled EMERGENCY ALERT SYSTEM and International Application PCT/US15/40421, filed on Jul. 14, 2015, titled COMMUNITY SECURITY SYSTEM USING INTELLIGENT INFORMATION SHARING, both applications of which claims priority of U.S. Provisional Patent Application Ser. No. 62/120,292, filed on Feb. 24, 2015, titled COMMUNITY SECURITY SYSTEM USING INTELLIGENT INFORMATION SHARING and U.S. Provisional Patent Application Ser. No. 62/033,404, filed on Aug. 5, 2014, titled A SYSTEM TO DETECT AND DETER INTRUDERS WHEN THEY ENTER A PRIVATE AREA WITHIN A COMMUNITY, which applications are incorporated by reference in this application in their entirety.

BACKGROUND

1. Field of the Invention

This application relates generally to security systems and, more particularly, to an automated system for designing and purchasing a private security system that allows for self-installation of the security system and automated monitoring of the system for maintenance.

2. Background

Conventional intruder alarm systems are set up by experienced professionals that generally work for established security companies. Potential customers, e.g., homeowners, call the company and establish a time for an installer to come to the home of the customer. Once at the home, the installer discusses the security needs or desires with the homeowner and provides the home owner with various options for securing the home. For example, the installer may discuss options for installing motion detectors, alarms, keypads, wireless door and window sensor. The homeowner then generally selects the desired components and desired component locations based upon price and need. The installer then installs the equipment, insures it is working property and walks the homeowner through the steps for using the system. Once installed, maintenance of the system is generally left to the homeowner to make sure the system is properly functioning and maintained.

A need exists for a system and method that allows users to design and order his or her private security system though an intelligent design, estimation and quotation service and that further enables a user to install his/her own private security system and then can provide for automated system monitoring for maintenance purposes.

SUMMARY

The present invention relates to an automated system for designing, purchasing and maintaining a security system. The system allows for the design and self-installation of the security system, as well as automated monitoring for maintenance.

The system of the present invention includes a computer implemented method for the automated purchasing of a security system having a plurality of security equipment components for use and installation on a unique geo-coordinate referenced location (i.e., a property). The system also includes a computer implemented method for installing the security equipment purchased for the property using the automated purchasing system.

In particular, the computer-implemented system for purchasing and installing security equipment on a property includes a computer-based purchasing system for facilitating the purchase of a security system on a property. The computer-based purchasing system (i) presents to a user, a recommended layout for a security system having security system components on an image of a unique geo-coordinate referenced location; (ii) allows the user to modify the recommended layout and select a final approved layout of security equipment components on the image of the referenced location; (iii) enables the user to purchase the security equipment components in accordance with the final approved layout; and associates a unique identification for the purchase of security equipment components on the final approved layout and saving the geo-coordinates for each of the security equipment components based upon the final approved layout.

The computer-based installation system for facilitating the installation of the security system (i) retrieves the final approved layout for the purchased security system based upon the unique identification associated with the purchase of security equipment components on the final approved layout; (ii) presents instructions for installing the purchased security system to the user, where the instructions include displaying an image showing the position of each security equipment component in the security system on the property; (iii) registers the location where each security equipment component is installed on the property by recording the geo-coordinate tag of the equipment; and (iv) verifies the proper installation location of each security equipment component by comparing the recorded geo-coordinate tag for each security equipment component with its geo-coordinate tag in the final approved layout.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention may be better understood by referring to the following figures. The components in the figures are not necessarily to scale, emphasis instead being placed upon illustrating the principles of the invention. In the figures, like reference numerals designate corresponding parts throughout the different views.

FIG. 5 illustrates an example customer record stored in the database of the shared supervisory server of the community monitoring system.

FIG. 7a depicts a flow diagram showing one example of an automated method for determining how to set-up a private security system in a private security area.

FIG. 7b depicts a flow diagram showing one example of an automated method for determining how to install a private security system in a private security area.

DETAILED DESCRIPTION

As described below in connection with FIGS. 1-7, the present invention can be used to automate the design, purchase, installation and maintenance of a private security system that may be used alone or in connection with other security systems, such as a community security system. The below description of the present invention to automate the design, purchase, installation and maintenance of a private security system, should not be considered limiting, but provided as one example of an implementation of the invention.

Figure 1:
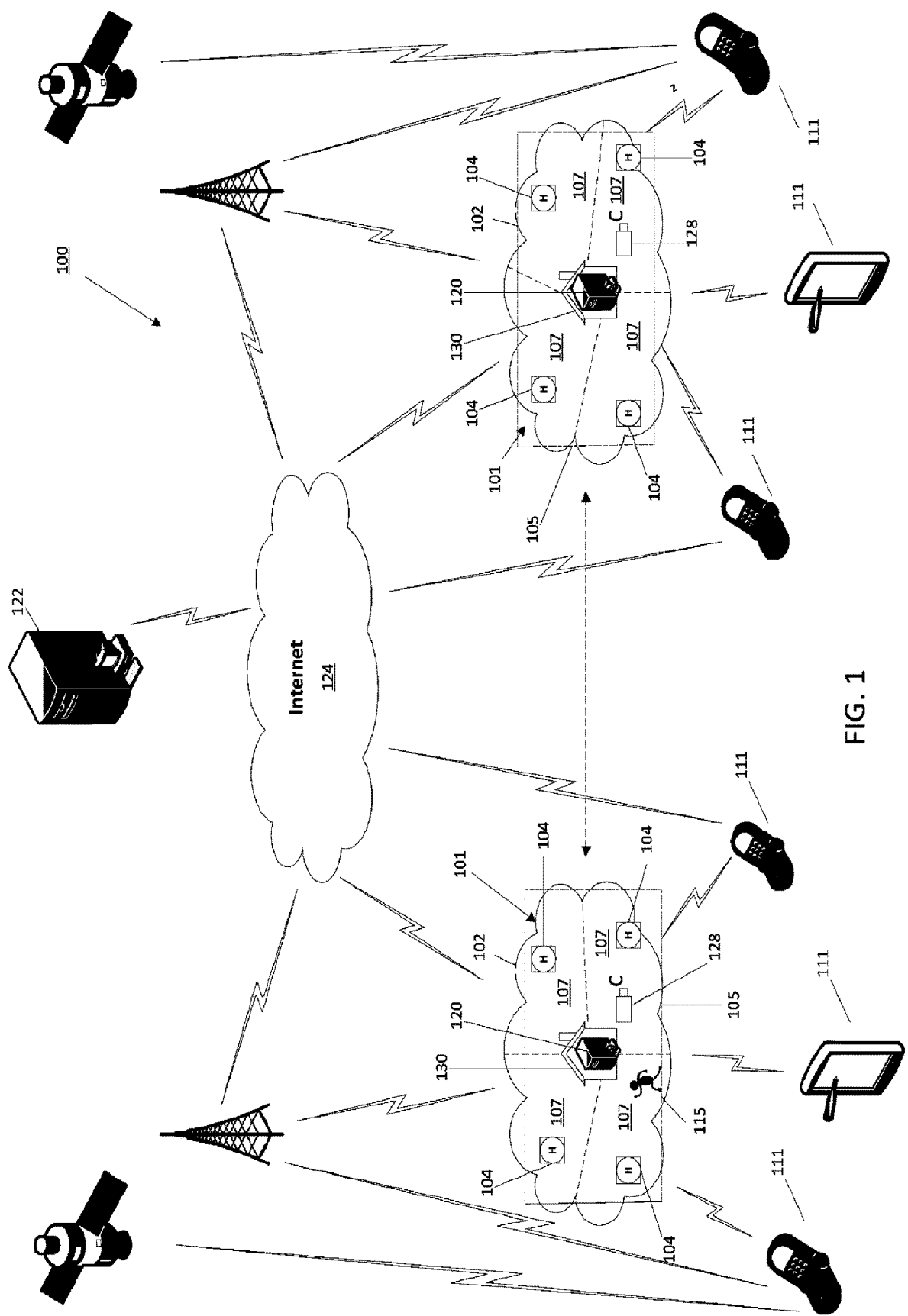
FIG. 1 illustrates a communication network for a community security system of the present invention.

For example, the present invention may be used in connection with a community security system 100 capable of monitoring multiple, generally adjacent, consecutive private security areas 102 in a community to confirm human activity, engage sensory alerts 309, 310 (see FIG. 3), which can determine the intelligent selection and/or automation of relevant equipment, such as a community CCTV camera 128. Each private security area 102 in the community is generally monitored by a private security system 101 that monitors the area external to a residential home or business 130 within certain predetermined perimeter boundaries 105. The private security systems 101 have the capability of being networked together to enable information sharing, thereby creating an intelligent community security system 100. FIG. 1 illustrates one example of a communications network for the intelligent community security system 100.

Each private security system 101 in the community includes detection devices 104 that use a detection field of view to detect humans 115 moving within various pre-defined horizontally and/or vertically spaced detection zones 107 within the private security area 102. These detection zones 107 may be established by the overlapping of fields of view or separately defined detection planes determined during the installation process. Each private security area 102 is divided into various detection zones 107 monitored by one or more separate detection device 104. As illustrated in FIG. 1, any detection information may be shared with adjacent or consecutive private security areas 102 through network communications via a master device 120 and shared supervisory server 122.

Figure 3:
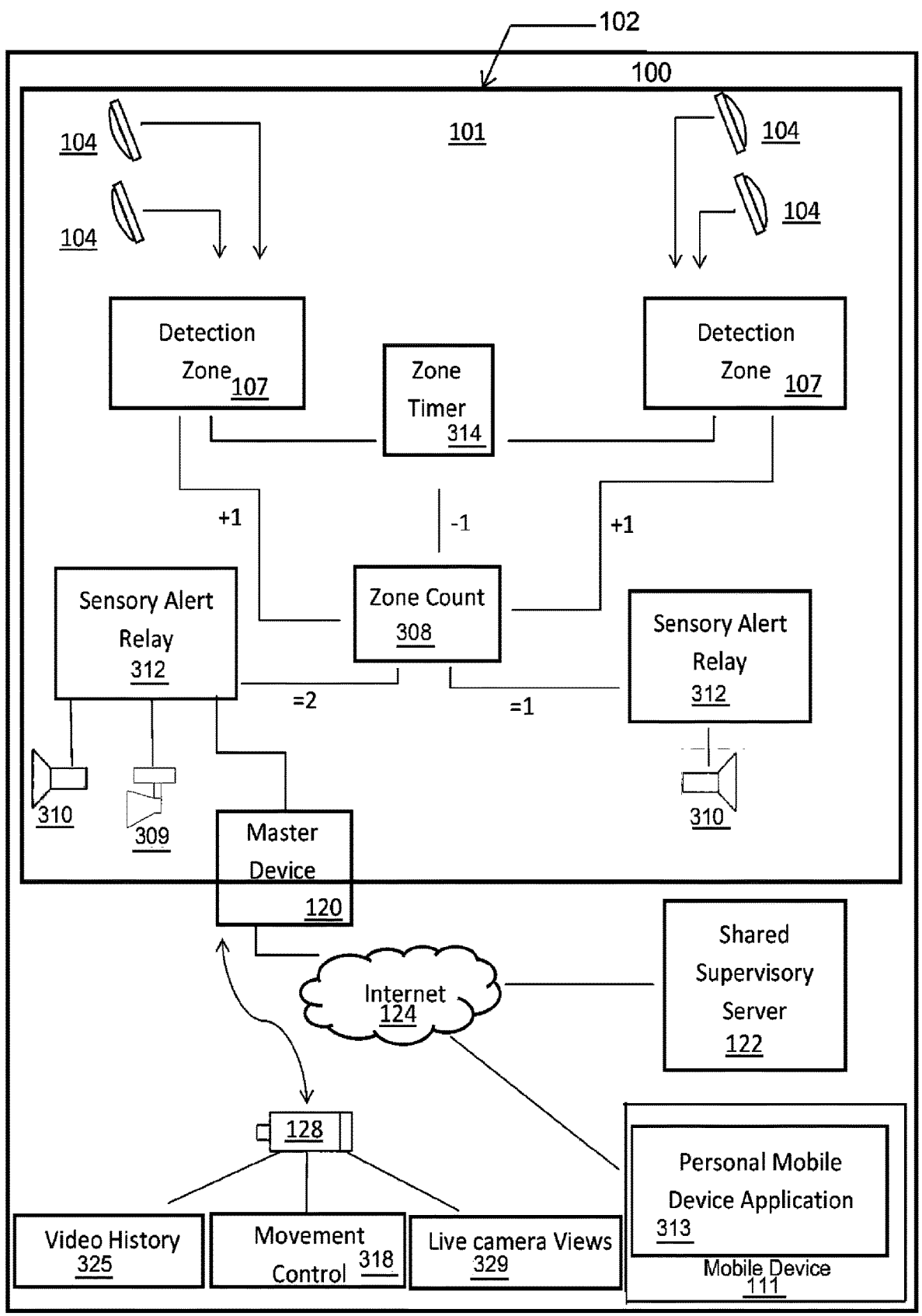
FIG. 3 is a block diagram of one example of an implementation of a private security system for monitoring a private security area in a community monitored as part of the community monitoring system of the present invention.

The detection devices 104 located within the private security areas 102 can communicate with other detection devices 104 in the private security area and with a master device 120 using a self-forming and propagating data communications network 401 (FIG. 4) formed between detection devices 104 and/or the master device 120 within the private security areas 102 and/or between adjacent or consecutive private security areas 102, using multiple redundant data pathways. The master device 120 could pass/act as a gateway to disperse this information via the Internet 124 to the shared supervisory server 122 for determination. As illustrated, the master device 120 can also communicate directly with user's mobile device 111 to disperse information to the users from the system and/or gather user information relevant to the operations of the system. For purposes of this application, a "mobile device" is any computing device that provides internet and/or cellular phone access, and may include, but not be limited to phones, table computers, wearable computers (e.g., glasses, watches, head-mounted displays), personal digital assistants, calculators, cameras, pagers, personal navigation devices, robots, game consoles, media player, mobile personal computers, etc. Applications running on mobile devices may be referred to as personal mobile device applications 313 (FIG. 3).

In operation, information gathered by individual detection devices 104 can be shared across multiple security areas 102 within the community security system 100 to confirm human activity and engage sensory alerts 309, 310. This gathered and shared information allows for human activity to be monitored throughout a community and across adjacent private security areas 102. Real world geo-coordinate equipment tagging, real-time GPS co-ordinate referencing of personal mobile devices 111 and real-time data analysis may be used to manage the relevant community members for response and assess risk to individual properties or private security areas 102 within the community security system 100.

Geo-coordinate equipment tagging and pre-determined detection zones 107 can be attached to detection devices 104 within a community security system 100 during installation, which can be used to manage the relevant sharing of information throughout the community security system 100. Real-time GPS co-ordinate application 313 (FIG. 3) for personal mobile devices for individual users/community members may also be used to facilitate relevant notification of alarm detections (i.e., determine notification response times) and control other events, such as determining the intelligent selection and/or automation of relevant equipment and/or the arming and disarming of private security systems 101. Additionally, real-time GPS co-ordinates for personal mobile devices 111 can be obtained and used to respond to personal panic/distress calls by community members, which could also enable nearby private security systems 101 to activate sensory alerts 309, 310 and notify other nearby community security systems 100 of distress or alarm situations.

The private security systems 101 can be programed to enable the self-learning of general patterns that could, for example, enable automatic arming and disarming of the private security system 101 to occur automatically or notify users of variations within the general patterns when they occur to enable manual intervention.

The community security system 100 could include a community CCTV camera system by grouping external cameras 128 located on private security areas 102 or public community areas into a single camera network accessible by all of the community group members. The community CCTV network could then provide access to live camera views 329, camera movement control 318 and store and provide video history 325 review to all of the community security system 100 group members. (FIG. 3)

The various system particulars of the community security system 100 and the private security system 101 generally described above are described in further detail below in connection with the respective figures.

Security System Overview

In general, the community security system 100 is one or more private security areas 102 monitored and protected by individually networked private security systems 101. A private security system 101 monitoring a private security area 102 can be a stand-alone system that is designed, purchased and installed in accordance with the present invention; however, the usefulness and functionality of the private security system 101, as explained below, can be greatly enhanced when single private security systems 101 monitoring private security areas 102 within a community are networked to create an intelligent community security system 100.

While not exclusive, the monitoring, detection and notification of security breaches employed in single private security systems 101 in private security areas 102 can form the basis for a larger community security system 100. The employment of one example of a single private security system 101 in a private security area 102 is described below.

Figure 2:
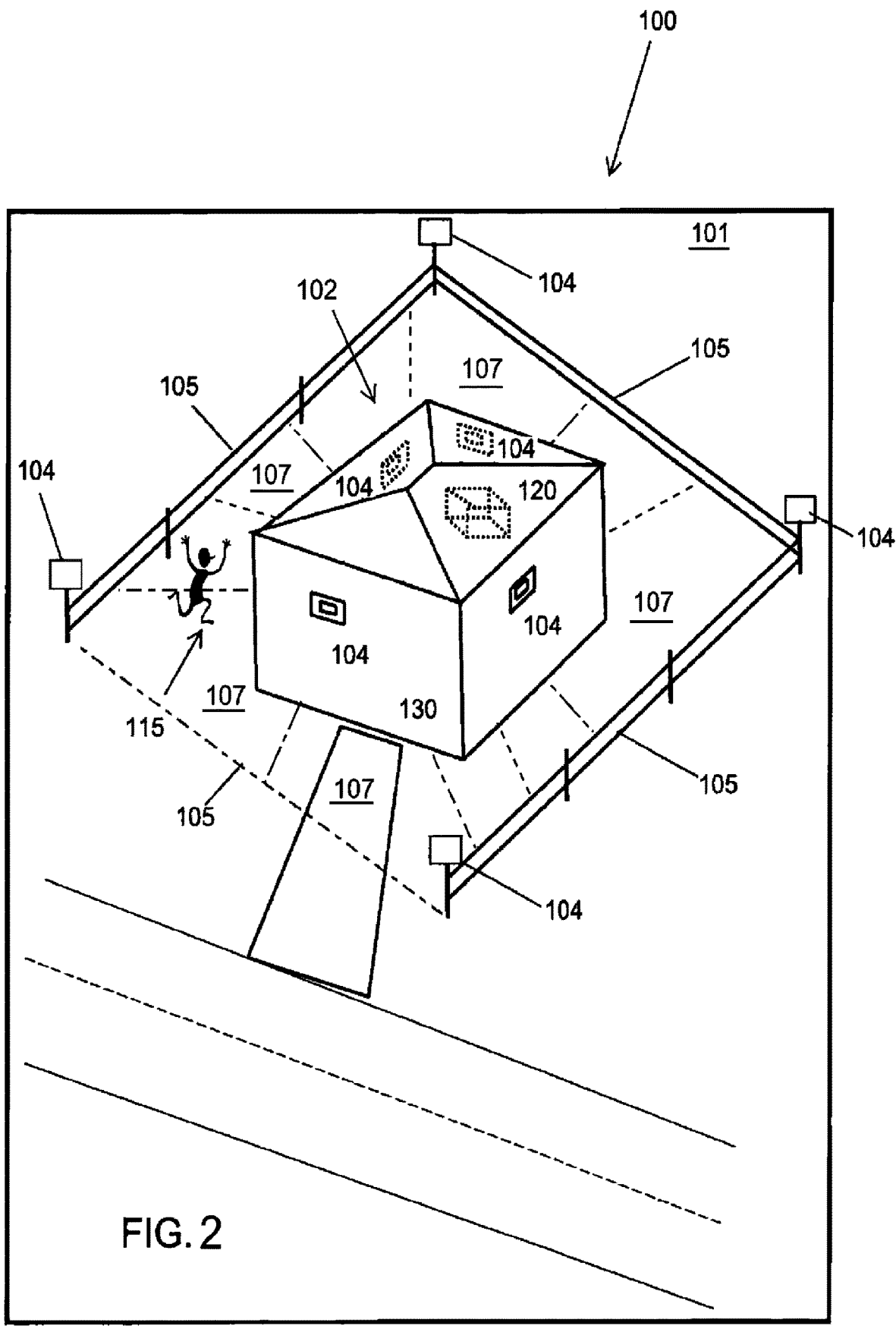
FIG. 2 plan view of a private security area forming part of the community security system of the present invention.

FIG. 2 illustrates a plan view of the private security area 102 of FIG. 1 that may be monitored by a private security system 101 to notify the owners of the private security system 101 of the presence of intruders 115. The private security area 102 to be monitored is defined, generally, by the property lines or by a specified area within the property lines or extending around any protected area or structure 130. The monitored area defined by established perimeter boundaries 105 may be deemed a restricted area. In sum, the private security area 102 can be defined by the area that the private security system 101 owner requires monitoring by designating perimeter boundaries 105, which may surround, for example, a physical structure 130.

The private security system 101 used within each private security area 102, such as the area surrounding a home, may include one or more detection devices 104 installed around the outside walls of the physically secured building 130 and/or about the perimeter of the private security area 102. One or more detection devices 104 may be housed within the same housing. Detection devices 104 may include, but not be limited to, any of the following devices capable of monitoring movement, or assisting with, monitoring or detecting activity in a given area: security cameras, lights, motion sensors, beam sensors, door sensors, and/or other motion detectors, including but not limited to a passive infrared (PIR) detectors.

Two detection devices 104 may monitor the same area from different horizontally and/or vertically space separated perspectives. These detection zones 107 may be determined by the complete or partial overlapping of fields of view or space separated detection planes ascertained during the installation process or as a function of the physical construction of the housing containing multiple detection devices 104. When each detection zone 107 is monitored by at least two detection devices 104, the chances of false intruder 115 detection are greatly reduced. In this manner, detection devices 104 may be installed to form multiple detection zones 107 (first, second, third . . . detection zones) within a private security area 102, which may be around the outside of a secured building 130. The number of detection zones 107 in a given area may depend upon the size and shape of the private security area 102 being monitored.

Figure 4:
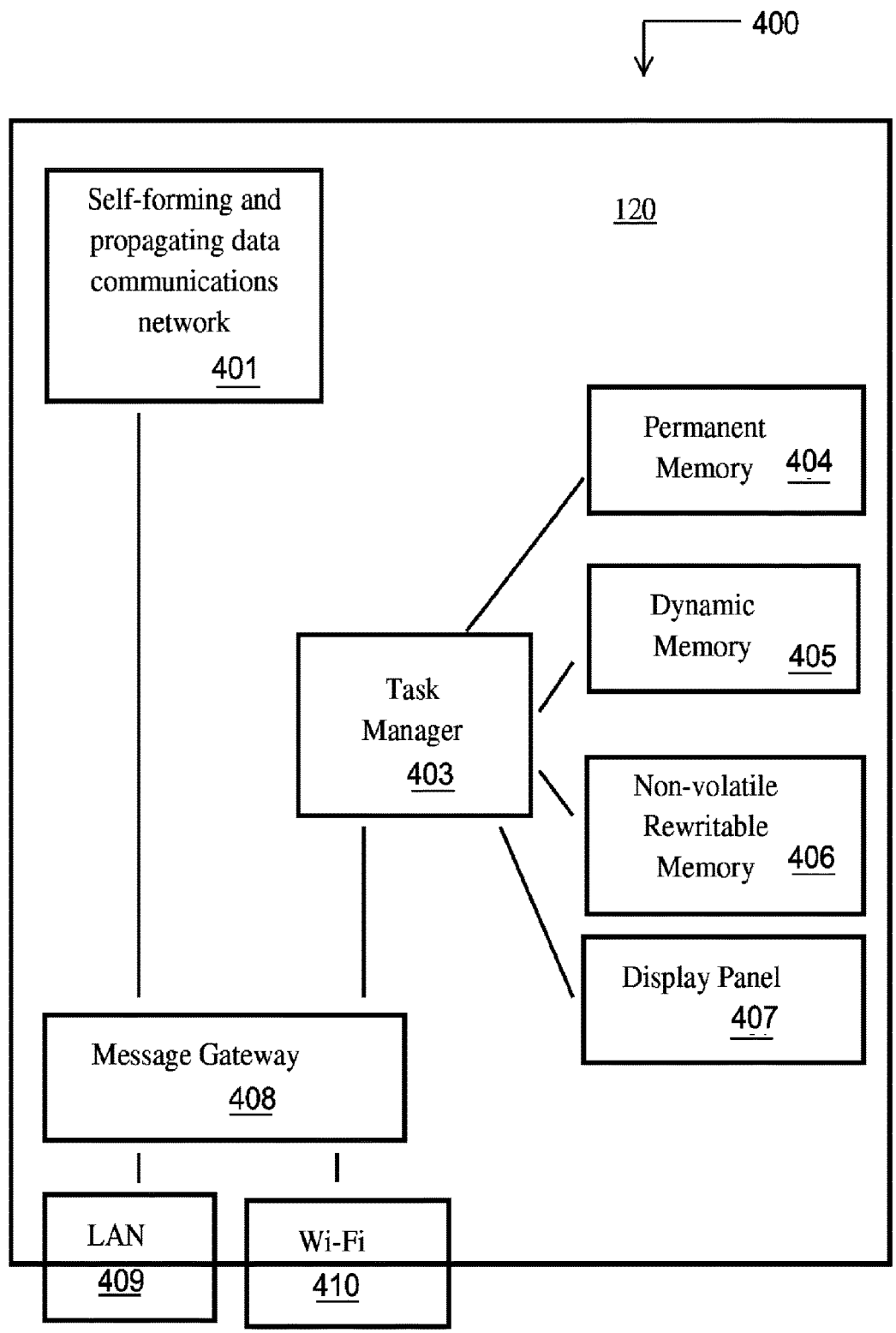
FIG. 4 depicts a block diagram of a master device of the private security system of FIG. 3.

The detection devices 104 may communicate with each other and/or the master device 120 using a self-forming and propagating data communications network 401 (See FIG. 4). This communications network 401 could be formed, for example, using a proprietary packet data radio transmission system. The private security system 101 may be wired, wireless or both and powered through the grid or independently powered by battery or renewable energy, such as solar energy, or both. As explained further below, the present invention provides the user with the ability to design, purchase, install and maintain the detection devices 104 without requiring professional installation. The present invention provides a "Do-It-Yourself" system that may be used alone or in conjunction with a community security system.

A private security system 101 may also include or share a master device 120, which can be located within the physically secured building 130, an adjacent building, or elsewhere within the community and powered from the grid. The master device 120 may contain its own battery backup to overcome short-term power outages. The master device 120 may also use a self-forming and propagating data communications network 401 to communicate with the detection devices 104. The master device 120 could pass/act as a gateway to disperse information via the Internet 124 to the shared supervisory server 122 for determination. The master device 120 may also dynamically take on some of the duties that would otherwise be performed by the shared supervisory server 122 for such reasons as loss of Internet connectivity or diversification of the workload and duties within the normal operation of the community security system 100. The master device 120 may also provide community connectivity to the Internet 124 using the cellphone network such as 3G/4G or other known physical Internet gateways etc., as illustrated in FIG. 1.

The master device 120 may communicate with a shared supervisory server 122 via the Internet 124 to exchange information, detection status and other functions etc. The master device 120 and/or the shared supervisory server 122 may communicate with a user's mobile device 111. Application(s) 313 residing on the personal mobile devices 111 may provide a user interface to the community security system 100.

Turning now to FIG. 3, FIG. 3 depicts a diagram of one example of an implementation of a private security system 101 of the present invention in a private security area 102. As illustrated, the private security system 101 may include a number of different detection devices 104, including, but not being limited to, any of the following devices capable of monitoring movement, or assisting with, monitoring or detecting activity in a given area: security cameras, lights, motion sensors, beam sensors, door sensors, and/or other motion detectors, including, but not limited to, a passive infrared (PIR) detectors. Those skilled in the art will recognize that any number of different detection devices, used alone or in combination, may be used in connection with the present system 100. As one or more detection devices 104 may be housed within the same housing, detection devices 104 may operate in a stand-alone manner to monitor a detection zone 107. However, it is envisaged that two detection devices 104 would monitor the same detection zone 107 from different horizontally and/or vertically space separated perspectives. These detection zones 107 may be determined by the overlapping of fields of view or space separated detection planes ascertained during the installation process. As noted above, when each detection zone 107 is monitored by at least two detection devices 104, the chances of false intruder 115 detection are reduced.

The private security system 101 also includes a zone timer 314 and zone counter 308 in communication with sensory alert relays 312 used to trigger sensory alerts 309 and 310, such as lights or sirens. As explained further below, the zone timer 314, zone counter 308 are used to determine when to trigger the sensory alerts 309 and 310 via the sensory alert relay 312. The private security system 101 includes a master device 120 for communication with the detection devices 104.

As illustrated in FIG. 4, which is an example block diagram of the master device 120, the master device 120 may include a self-forming and propagating data communications network 401, a task manager or controller 403, permanent, dynamic and non-volatile memory 404, 405, 406 and 407, as well as display panel 407, message gateway 408 and LAN and/or Wi-Fi connectivity 410. In this example, the detection devices 104 can communicate with each other and/or the master device 120 using the self-forming and propagating data communications network 401 to monitor, detect or help detect intruder 115 movement in the private security area 102.

Turning back to FIG. 3, the master device 120 may communicate with multiple types of detection devices 104 using the self-forming and propagating data communications network 401 and pass/act as a gateway to disperse this collected data to the shared supervisory server 122 via the Internet 124. The detection devices 104 could be detecting but the shared supervisory server 122 makes a determination as to whether or not these detections should be ignored, such as when the private security system 101 is in a disarmed state. Arming/Disarming of the private security system 101 may be accomplished via a user's/members personal mobile device application 313 either manually or by proximity using GPS co-ordinate references.

The shared supervisory server 122 may configure the community security system 100, aid in the monitoring of detection zones 107 and generate/receive notification from personal mobile device applications 313 that may be accessed via the Internet 124. The LAN 409/Wi-Fi router 410 may connect the private security system 101 with the Internet 124, while providing wireless internet capabilities to the private security area 102 and/or the community security system 100. Community CCTV cameras 128 may provide analog or digital video and this video may be formatted or reformatted into a common format for storage as video history 325. Movement control 318 and live camera views 329 may also be provided in connection with the CCTV cameras 128.

Detection devices 104, lights 310, and sirens 309 may be located outside of the building and cover the private security area 102. When an intruder 115 is detected in the private security area 102, the sensory alert relay 312 may be instructed to activate or otherwise turn on a light 310, siren 309, and/or other means of sensory alert to announce to the intruder that they have been detected in the private security area 102 prior to breaching the physically secured building 130 and/or other type of restricted zone. As such, the intruders' window of opportunity has already expired. Knowing this, the intruder 115 is more likely to leave the private area external to the physically secured building 130 and/or other type of restricted zone without perpetrating a criminal act minimizing the risk of financial loss/damage or a personal injury occurring due to a violent act.

Those skilled in the art will recognize that the master device 120 may also dynamically take on some of the duties that would otherwise be performed by the shared supervisory server 122 for such reasons as loss of Internet connectivity or diversification of the workload and duties within the normal operation of the community security system 100. An operations described as performed by the supervisory server 122 should not be so limited and may be performed by the master device 120.

Turning again to FIG. 4, the primary function of the master device 120 could be considered as a bi-directional data gateway between the self-forming and propagating data network 401 and the shared supervisory server 122. The master device 120 may include permanent memory 404 which is ROM or re-programmable and contains the firmware for the master device 120 functions, dynamic memory 405 such as RAM to store data values and instructions for use by and during the execution of the firmware and non-volatile rewriteable memory such as HDD or SSD 406 to hold information such as the customer record database, alarm status etc.

The master device 120 has the ability to facilitate detection device 104 communications between each other and the master device 120 using the self-forming and propagating data communications network 401. The communication route between each of the detection devices 104 and the master device 120 is dynamic. All detection devices 104 find a data route back to a master device 120. If the closest master device 120 is unavailable for any reason, such as a loss of power or failure, then the detection devices 104 will continue to pass messages via the self-forming and propagating data communications network 401 between each other until the route to another master device 120 is determined. This self-forming and propagating data communications network 401 uses a non-specific routing protocol which could be formed, for example, using a proprietary packet data radio transmission system. The master device 120 includes a message gateway 408, which facilitates the passing of communications internally within the master device 120. The message gateway 408 may also pass/receive messages from the detection devices 104, lights 310 sirens 309 and/or other sensory alert means via the self-forming and propagating data communications network 401. The message gateway 408 may also pass messages externally via LAN 409 and/or Wi-Fi 410 over the Internet 124 to the shared supervisory server 122 (FIGS. 1 and 3) and/or individual users through their personal mobile devices 111 (FIGS. 1 and 3). The LAN 409 and/or Wi-Fi 410 modules may physically reside within or be external to the master device 120.

The master device 120 includes a task manager or controller 403, which may be responsible for the internal management of the master device 120. The task manager 403 may co-ordinate tasks such as the syncing of customer records with the shared supervisory server 122, managing firmware updates, and collecting alarm status if the shared supervisory server 122 is off-line due to for example, power or internet loss. The collected alarm records may be forwarded on to the shared supervisory server 122 once communication is re-established. A display panel 407 such as a touch display may be used with the master device 120 to provide a user interface to setup and configure the master device 120, the private security system 101 and or the community security system 100.

As noted above, the master device 120 may dynamically take on some of the duties that would otherwise be performed by the shared supervisory server 122 for such reasons as loss of internet connectivity or diversification of the workload and duties within the normal operation of the community security system 100.

FIG. 5 is one example of a customer record that may be stored in the system database (not shown) of shared supervisory server 122. The customer record 502 may have text fields 504 for identification of site name, GPS location, address, group/community memberships, system status, configuration/setup parameters, application registrations, current site internet protocol (IP) address, event logs, action logs, communication/chat history, and user access security. The customer record 502 may also keep track of changes to the database record in a record change history filed 506. Additional or few fields may be used and are typically dependent upon implementation. The database may be implemented as a flat file, liked lists or other data structure, or a relational database such as SQL. The database record may be located at the shared supervisory server 122.

The private security system 101 may be designed to use very low power consumption (replaceable battery and/or solar or other renewable battery charging solutions) and, especially in connection with the installation system of the present invention, may be wirelessly installed using the two stage fixing system with the personal mobile device application 313 for installation guidance. The two stage fixing system would comprise an instant adhesive as a primary fixer such as double sided tape for positioning/locating detectors to a wall or fence making it possible for the secondary fixing system such as a durable liquid adhesive, screws, nails etc. to cure or be installed.

The master device 120 has the ability to facilitate detection devices 104 to communicate with each other using the self-forming and propagating data communications network 401. This network uses a non-specific routing protocol, which could dynamically use one or more detection devices 104 to pass on a data signal to/from a specific detection device 104 back to the master device 120. The master device 120 also provides an internet 124 gateway for communication with the shared supervisory server 122 and individual users through their personal mobile device application 313 and/or other personal technologies 111.

The shared supervisory server 122 is located at a secure location away from the location of any private security system 101. The shared supervisory server 122 uses a communications means such as the internet 124 to provide communications with many individual private security systems 101. It could provide a web site or personal mobile device application 313 interface for the family group administrator to access information and status and control of their single system 101 via normal internet technologies.

The shared supervisory server 122 provides automated account management services for the family group administrators and community groups, and the linking/securing of the owner's/authorized person's mobile device 111 or other personal technologies to the owner's private security system 101 and community groups. The shared supervisory server 122 provides a secure portal for access to a community CCTV network.

The shared supervisory server 122 manages the database 500 which includes customer records 502 containing information 504 such as but not limited to: (i) site name; (ii) site geo-coordinate location; (iii) geo-coordinate location of all detection devices/master devices/community CCTV cameras etc.; (iv) address; (v) family group; (vi) group members current geo-coordinate locations; (vii) group/community memberships; (viii) system status; (ix) physical hardware configuration/setup; (x) application registrations; (xi) current site IP address; (xii) event log; (xiii) action log; (xiv) communications/chat history; (xv) panic logging, tracking, recording (xi) user access security/IP address and a record change history 506.

Several separate private security systems 101 installed for several individual owners could be considered as a group or community for the purpose of inter-system management, information/data exchange, notification and control by the owners/members within such a community. System membership to one group is not exclusive. One system can be a member of several groups concurrently, including but not limited to property boundary neighbors, local street, housing estate, church group, sports group, watch groups, employee groups.

Installing a private security system 101 in each home along a street or estate housing block would be considered a community security system 100 providing a curtain of security throughout the street or estate. Each home has an absolute geo co-ordinate location and each detection device 104 has an absolute geo co-ordinate location. The shared supervisory server 122 can intelligently determine when human detection from one detection device 104 at one private security area 102 needs to be shared with that of another private security area 102 (based on proximity). This has the effect of expanding a private security area's 102 security curtain beyond its private security area 102 boundary. Each community member is only installing a small part of the overall community security system 100.

Figure 6:
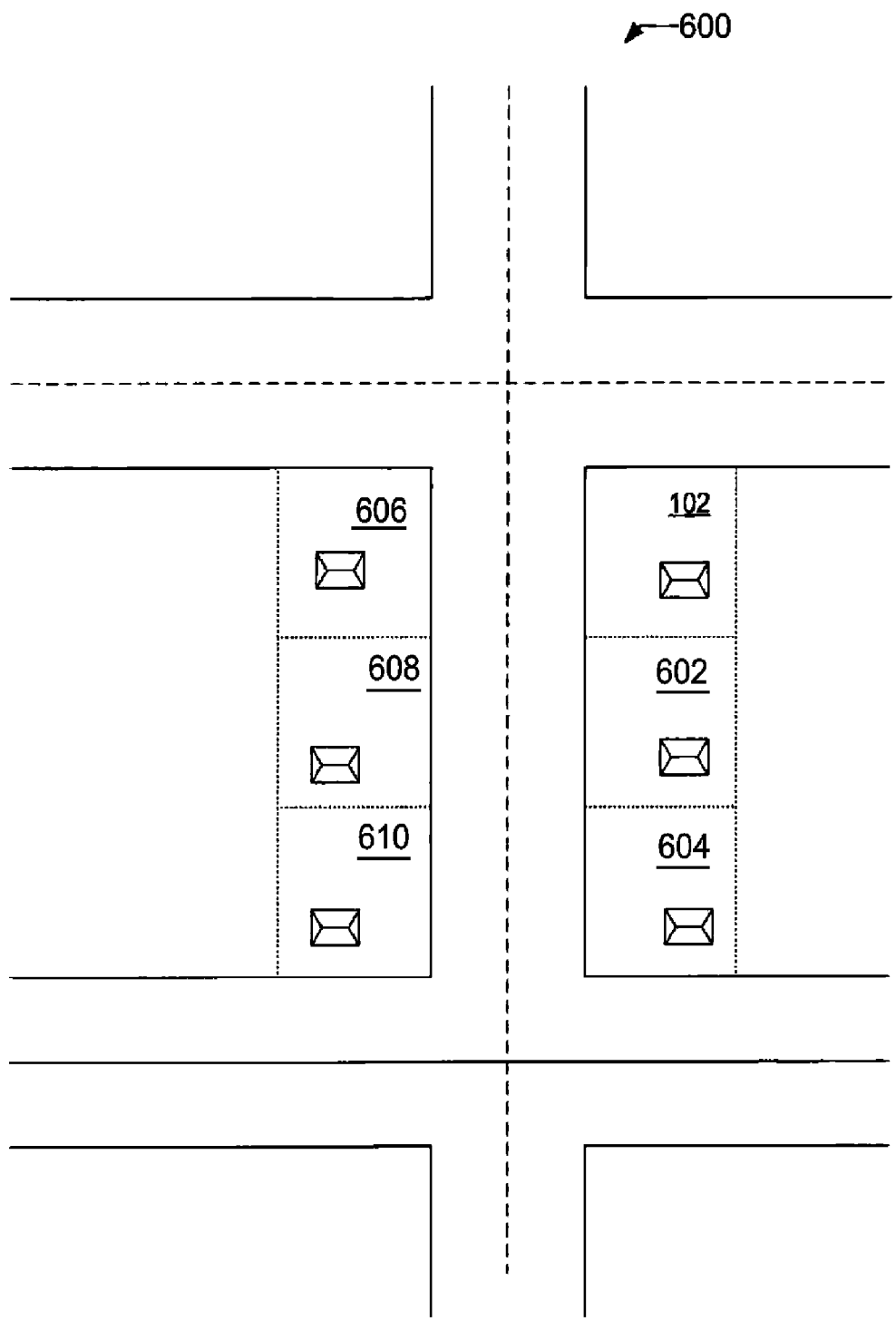
FIG. 6 illustrates a drawing of multiple private security areas forming a community security system.

FIG. 6 is a drawing 600 of private security areas 102 of FIGS. 1 and 2 and other private security areas 602-610 outside of structures are depicted. Each of the private areas 102 and 602-610 may have a private security system 101 that all communicate with a shared supervisory server 122 through a master device 120. When the private security system 101 detects an intruder 115 in the private security area 102 external to the physically secured building 130 and/or other type of restricted zone and notifies the owner/authorized person, an additional notification may be sent to other members in a group or community (such as home owners, family members or occupants of 602-610 of FIG. 6) that identifies the previous location and movements of the intruder 115. The notification may be as, but not limited to: text messages, sound prompts, voice messages, graphical descriptions and/or photos sent a user's personal mobile device 111, which may be accessible directly or via a personal mobile device application 313 on the users' mobile device 111.

Information provided may include, but not be limited to, identification of the property, time of intruders' movements, warnings, response and actions of other authorized users, communications/chat between authorized users. The notification to other groups or communities may be directed via the shared supervisory server 122.

By way of example, private security system 101 detects an intruder 115 in private security area 102 and notifies the owner/authorized user of the intruder 115. The private security system 101 may also notify the adjacent private security area 602 of an intruder 115 being detected via the shared supervisory server 122 internet 124 and/or self-forming and propagating data communications network 401. The private security system 101 associated with private area 602 may then go on a heightened status and actively attempt to detect an intruder 115. If a calculated directional heading a relative distance of the intruder 115 is ascertainable by the shared supervisory server 122, then more directed notices to other private security systems 101 and their home owners may occur.

The shared supervisory server 122 contains the customer record 502 related to each member and all installed hardware such as; detection devices 104 CCTV cameras 128 etc. within the community security system 100. The shared supervisory server 122 may use alarm events and other real-time event information such as; arming and disarming to conduct statistical analysis to create status reports for the purpose of further improving the overall community security. This information may be made available through the social media forum available to the community members. The shared supervisory server also facilitates access to the CCTV cameras 128, which creates the community CCTV system. Thus, event data, captured CCTV video history 325, live camera views 329 and detected intruder 115 information may be shared among multiple private security systems 101.

A website interface could integrate several third party services and technologies, including, but not limited to: a world mapping service to locate the owners property/restricted zone, obtain the geo-coordinates location of the property/restricted zone, facilitate site analysis and system design and estimation and quotation tool, goods sales/ordering and payment system, and create the customer record details on a shared supervisory server 122 to accept communications from the owner's new system, use the geo-coordinates location and social media sites such as but not limited to, Facebook and Twitter, to cross reference friend lists to analyze and recommend possible community groups to be joined, and have automated account management services for the owners and community groups, and the linking/securing of the owner's/authorized person's mobile devices 111 to the owner's system and community groups.

In accordance with the present invention, each private security area 102 owner within a community could install a self-powered/mains powered, wired/wireless CCTV camera 128. This could be an option provided to a user in the design and installation of his/her system. This camera 128 could include a recording means for gathering video history 325, a movement control means 318 (pan, tilt, zoom) and a remote review means to allow community group members to access the video history 325 and/or live camera views 329 of not just their own camera but other cameras within the community group. Each individuals/groups cost outlay is reduced but each group member has access to the larger community security system 100 network that is created. This CCTV camera network could be linked together through the LAN 409, Wi-Fi 410, and/or Internet 124 using the cellphone network such as 3G/4G or other internet gateways etc. The community CCTV camera network may be installed by a body corporate, home owners association, county, city, municipality, neighborhood, or individual members each installing one or more cameras 128 etc. for the benefit of all community members.

When installed, a physical geo-coordinate reference is associated with each camera 128 and is used to determine camera 128 selection by the members. This could be a map display of camera 128 locations or assist the member by recommending appropriate camera 128 selections for their current requirement. Footage from the camera 128 could be used by the gatehouse, security patrol, police authority etc. to aid in the identification/apprehension of an intruder 115.

Access to the CCTV camera video history 325 of live camera view 329, could be securely managed by the shared supervisory server 122 through a personal mobile device application 313, secure website, etc. The CCTV system is not used to do human 115 detection and as such, does not form a detection zone 107. It is purely used to provide live vision 329 and recorded video history 325 of general activity and/or automated detection events throughout the community.

As home owners are already members of community groups, it is envisaged that social media sharing of general information relating to individual security and community security could be contributed to and shared with other members of the community group. This information could consist of written texts, chat, photos, video, other media content etc. for the purpose of discussing, detailing, reducing and ultimately preventing criminal activity within the community.

Alarm status metrics etc. from community group member's private security systems 101 could be gathered individually or grouped for statistical analysis, presentation and review by the community group members. This could be presented as a simplistic level of probability of criminal activity. While this information is a valuable tool for this community group, it is also of value for law enforcement, aiding in the prevention of criminal activities within this community and adjacent communities.

It is intended that this social media service would be an integrated part of the website, personal mobile device application 313 and any related system application. The social media content related to community groups (as a system can be a member of more than one) is presented through the social media login page interface on the personal mobile device application 313. Each home owner's social media page would be locked to the unique identification number of the individual system and formatted based on its community group memberships, using chosen settings and preferences to filter the viewable content. The social media content uses privacy settings to allow group members to choose what is/is not publically viewable, preserving the group members' privacy.

Purchasing, Installing & Setting up the System

While the system may be professionally installed, the present invention provides for a user to acquire the system in a "Do-It-Yourself" environment over the Internet, via a store kiosk, or other means for collecting data and helping the user make remote purchasing decisions. As explained further below, remote access software can help potential customers build their own security system based upon the desired private security area 101 that the user desires to monitor. For example, a website or application hosting design software may be accessible by potential customers for purchasing a security system. The application may describe the product, product pricing, installation, operation and maintenance of the system. The software may integrate satellite mapping technology such as Google® Maps (or other similar mapping technology capable of showing a plan view of a property) to allow the system to access satellite imagery of the area that user desires to protect via a security system. The potential customer can then enter his/her street address to access the imagery and be presented with a satellite view of his/her home.

Based upon the satellite imagery and other information provided by the potential customer, the software is able to recommend system requirements such as: number of detection devices 104, type of detection devices 104, and placement of detection devices 104 around the private area external to the physically secured building 130 and/or other type of restricted zone. The software may also show how the placement of the devices 104 provides overlapping monitored areas and how detection zones 107 are formed. The customer can then modify the recommended coverage as desired. While the installation process is described by the layout of detection devices 104, it should be recognized that any type of the security system equipment can be recommended for purchase and placement without departing from the scope of the invention and that the installation process should not be limited to detection devices 104.

The software can determine a perimeter 105 or ask the user to create the perimeter 105 and then calculate the area that is required to be monitored. Based upon the size of the area and the shape of any structures located within the area, the system can determine where detection devices 104 should be placed to provide optimal monitoring of the defined area within the perimeter 105. As noted above, it may be desired to have two separate detection devices 104 monitor all areas. The size of the area and type of detection devices 104 available will dictate the placement of the detection devices 104 on the structures and within the perimeter 105 to create optimal coverage. The customer may be given the opportunity to modify any software recommendations based upon price, coverage, etc.

If the customer has modified his/her detection device 104 placement, the software can reanalyze this new configuration of the detection devices 104, displaying the newly covered area and giving further recommendations as necessary for system viability. The software can model the curtain of security around the private area external to the physically secured building 130 and/or other type of restricted zone. The software can then provide the user with a quote, and facilitate the purchasing of the system online through the use of a proprietary, standard or other form of e-commerce purchasing platform.

Upon purchase, the purchaser can create a customer account that is automatically saved on the associated shared supervisory server 122 creating a customer record 502 that contains information 504 such as: name, unique identification number, community membership, geo-coordinate locations based on the Google® map (or other similar mapping technology capable of showing a plan view of a property). The purchased product is then shipped/delivered to the purchaser, where it may be installed as per geo-coordinate instructions shipped with the product or available through the shared supervisory server 122 or displayed through the personal mobile device application 313 in communication with the server 122. Once installed, integrity checks can be performed on the devices 104 to verify the functionality of each device 104. After the initial integrity check, future integrity checks can be performed automatically at predetermined times, or as initiated by the customer, to ensure the on-going operation of the system and its components and to provide regular maintenance for the system and its devices 104.

FIG. 7a depicts a flow diagram 700 showing one example of an automated method for setting up a private security system 101 in a private security area 102 as described above. In the described example, the process is automated via an application 313 or website. In step 702, the property is first identified by input, for example, the property address. Based upon the user input, the application or website determines the geo-coordinate location for the installation. The perimeter for the secured area may be automatically defined, user defined or a combination of both. The software may further determine, based upon the satellite image, property boundaries and structures on the premises that affect the recommended detection zones 107. At step 704, a satellite image map or other geo-coordinate referencing technology is used to display information to the user, such a plan view of the property or other depiction of the installation location along with a proposed device 104/master device 120 layout.

The user can then select and arrange the desired devices 104 based on their preferences. At step 706, the software can then analyze the user input and intelligently rearrange the equipment selection and suggest changes. For example, the software can determine the recommended type and location of the detection devices 104 on the property for optimal coverage. Once analyzed, the software can then, at step 708, display the suggested equipment layout on an updated satellite map view or other image to the user for approval.

Once the software provides the user with a recommended layout for the security system, the user is then able to review, modify and approve the system configuration, at step 710, which once finalized is saved, associated with an installation identification number and a customer record, which may be supplied to the associated governing supervisory server 122. Optionally, the application software that manages the system design and purchase may reside on the associated governing supervisory server 122, such that the system is automatically integrated into a community based system. The design can then be integrated into the community based system from initiation and can take the community based system into account when intelligently rearranging the equipment selection and suggesting changes.

Once the system is purchased, the system is then shipped to the user for installation with specific installation instructions. FIG. 7b depicts a flow diagram 720 showing one example of an automated method for determining how to install a private security system 101 in a private security area 102. In one example, for installation, the customer receives a unique identification number (or installation number) and information to download a setup application 313 to their personal mobile device 111, at step 722. Once installed, the application 313 may ask for the unique identification number assigned to the customer order. At step 724, the application 313 is then able to access the customer's account through the shared supervisory server 122 or other remote server managing the installation process and guides the customer through installation, including but not limited to unpacking, equipment installation, communication initiation, etc.

To assist with installation, at step 726, the application 313 may show the satellite map view or other image layout created during the ordering process detailing the placement of the detection devices 104. This view may be provided for the installation of each detection device 104.

Using the mobile device application 313 for guidance, the user positions each piece of equipment and/or device, taking into account orientation & proper location. When installing each device 104, at step 728, the customer may hold the first detection device 104 in the position highlighted on the personal mobile device application 313. The detection device 104 can use environmental sensors to determine that its horizontal orientation is correct. The personal mobile device application 313 then announces that it is time for the customer to attach the detection device 104 using its two stage fixing system. Once installed, the application 313 may provide for the customer to highlight the installed detection device 104 on his/her personal mobile device application 313 and confirms its actual geo-coordinate location whilst standing next to this detection device 104. Optionally, the detection device 104 may be geo-location enabled and capable of confirming its geo-coordinate location. This step may be repeated with the installation of each device 104. By requiring this, the application 313, at step 730, can confirm the installation of all detection devices 104, verify geo-coordinate tags against the installation map/image and record their installation location. All this information may be recorded on a shared supervisory server 122 or other server managing the security system either locally or remotely at step 732.

The application 313 may also provide for the registration and initialization of the all the detection devices 104 with the network system via the master 120 or shared supervisory server 122 and initializes system communication with all components to establish communication paths. Security keys may be used to lock communication of the new system together and may instruct the customer to verify the system using a physical walkthrough process of all monitored areas/zones 107 with, for example, onscreen personal mobile device application 313 validation.

During the setup phase, if the system is part of a community, community group membership may be selected. The personal mobile device application 313 interrogates the shared supervisory server 122 to determine or restrict groups using the geo-coordinates location, fee structure and/or social media sites such as but not limited to, Facebook and Twitter, to cross-reference friend lists. The arming/disarming regime may also be selected. Certain select pre-set features may also be modified during the set-up phase, as necessary or desired. Modifiable features may include, but not be limited to, the following: (i) engagement of audible or visual sensory alerts; (ii) notification priority for first and/or second movement detections (i.e., who receives the alert and who responds) and (iii) local requirement/restriction compliance features.

Groups may be formed, managed and notified based upon family members, mobile devices 111 associated with members of the household. Individuals added to a group may be provided with downloads of applications 313 for their personal mobile devices 111 to become group members and receive notifications. New members may be provided with a unique identification number to become members to a group. Membership can be formed and managed by an administrator, which permits group access and establishes members.

Groups can also be established based upon geography, which may be a community group or a sub-set of a community group created either by a predetermined radius around a customer's private security area 102 and/or other type of restricted zone or directly abutting neighbors. Groups could be formed based upon residences of communities, streets, official response group (gatehouse, community security, police etc.) or other defined groups, such as social groups, work colleagues and/or watch groups, to name a few.

Maintaining the System

Upon registration and initialization of the all the detection devices 104 with the network system, the master 120 or shared supervisory server 122, other networked server or device 104 controls can initiate an integrity check of the device 104 or system equipment. This check can then be performed periodically for system maintenance.

Figure 7C:
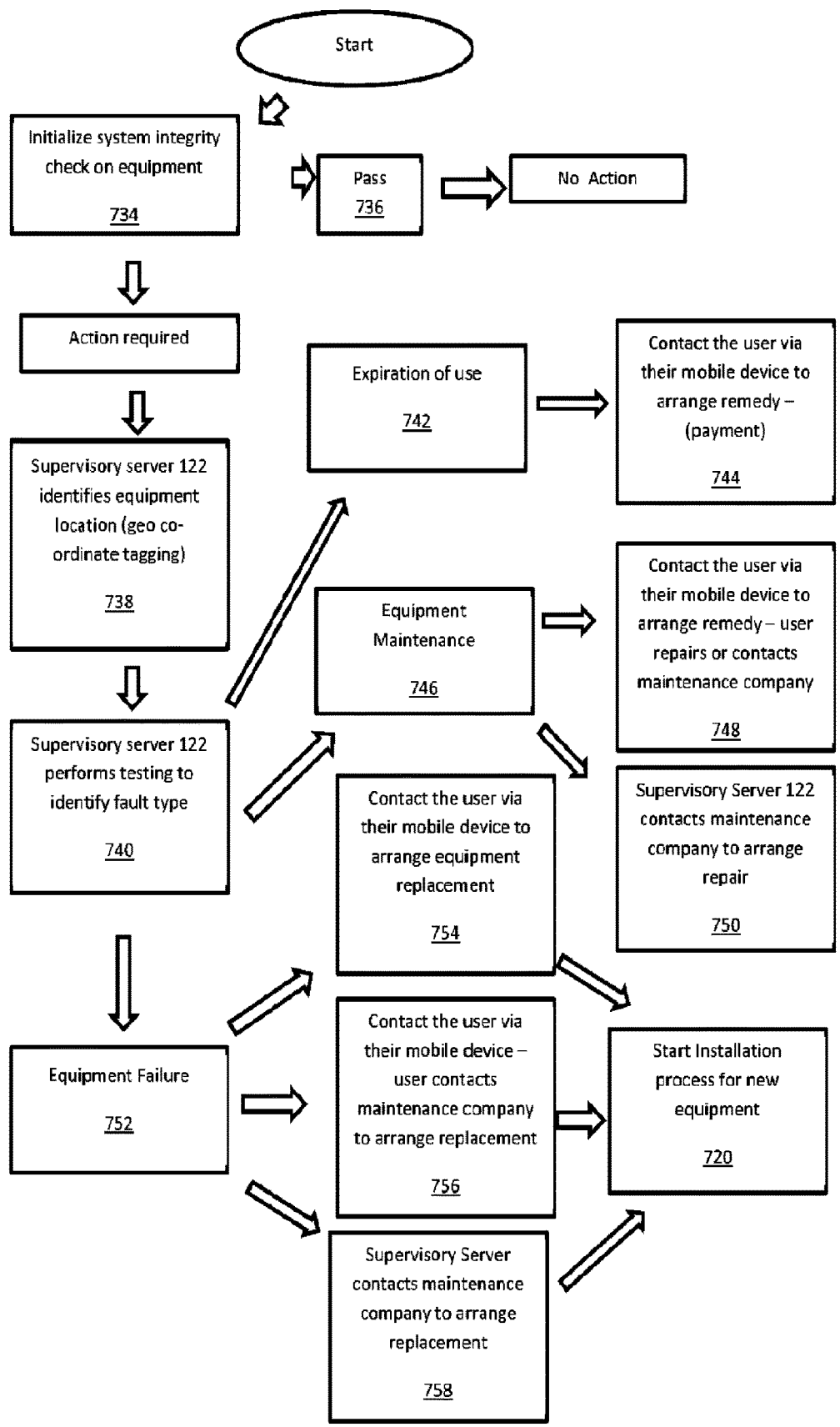
FIG. 7c depicts a flow diagram showing automated system monitoring for maintenance and function.

FIG. 7c depicts a flow diagram showing automated system monitoring for maintenance and function. Once the equipment is installed and powered on, an integrity check may be performed on the equipment to confirm the correct functionality of the installed equipment. This integrity check may be performed not only on the initial start-up of the equipment but also at predetermined times to ensure the proper maintenance of the system equipment. The system integrity check can be initiated by the network server in communication with the system equipment once installed.

As illustrated in FIG. 7c, at step 734, once the equipment is powered on and network connected, the system initializes an integrity check. If the equipment passes the check, at step 736, no further action is taken. If the system fails the integrity check, further action is required. If further action is required, the server, such as the supervisory server 122, that is in network communication with the installed equipment will then identify the location of the equipment that failed to pass the integrity check. The system may identify the location of the equipment by its geo-coordinate tagging, which is stored in the server 122 or provided by the device. The identification of the equipment by the server based upon its geo-location is performed at step 738 in FIG. 7c.

Once the identification of the equipment that failed to pass the integrity check is identified, the server then performs further testing on the equipment to identify the fault type for the equipment that failed to pass the integrity check. This fault testing is done at step 740 of FIG. 7c. If the equipment is of the type that requires a subscription and the failure to pass the integrity check is deemed to be due to the expiration of use at step 742, the user is contacted for example, via their mobile device, to notify the user of the non-function of the equipment based upon the expiration of use (i.e., failure to pay), at step 744. The user may then remedy the expiration of use failure by making a payment arrangement or renewing the terms of use as required by the contract service provider for the equipment.

If the fault type is identified as something other than expiration of use or that requires service at step 746 (i.e., equipment maintenance), the supervisory server 122 or other network server may then contact the user, again, for example, via their mobile device to notify the user of the need for equipment maintenance and to ask the user to arrange for repair or contact the maintenance company, at step 748. Alternatively, at step 750, the supervisory server 122 or other network server may initiate contact with the maintenance company that services the system and arrange repair directly. The latter could be automated when the system is under a maintenance contract.

If the integrity check identifies complete equipment failure at step 752, the supervisory server 112 or other network server may then perform one of several options: (i) contact the user to arrange equipment replacement, at step 754; (ii) contact the user to engage a maintenance company to arrange replacement, at step 756; or (iii) have the supervisory server contact the maintenance company directly to arrange replacement, at step 758.

If replacement of the equipment is needed and the user is asked directly to replace the equipment at step 754, the user may use the same purchasing and installation process for the new equipment as found in FIG. 7a, at step 720. While maintenance and integrity checks can be performed on all system devices 104, it is recognized that integrity checks may be performed on all security system equipment and is not limited only to a device 104.

System Management

The customer may designate a system administrator during design and purchasing of the system. The system administrator will be the contact for communications regarding the design, purchase, installation and maintenance of the system. For example, when equipment problems arise, the system administrator will be the one that is automatically contacted by the server managing the system, or, the system administrator may establish automated handling of system integrity problems or equipment faults directly with the service provider contracted to provide maintenance and system repair, as described above.

The system administrator may, for example, be given the ability to perform the following functions, among others: (i) change the membership within a group; (ii) change the notification order if human movement is detected (on holidays etc.); (iii) introduce a delay period when the system is armed; (iv) receive notification of low power/faulty detection devices 104; (v) control fee payment reminders (depending on the community fee structure); (vi) obtain history/ statistic reports (human movement detected, system arming, system response); (vii) control automatic reporting/reordering of faulty equipment and delivery information of replacement equipment due to the shared supervisory server 122 account information/payment information and (viii) manage the group member forum and general information exchange e.g. watch out for suspicious black sedan in area.

Examples of the invention are discussed herein with reference to FIGS. 1-7; however, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are numerous modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will now be described in detail with reference to embodiments thereof as illustrated in the accompanying drawings.

From reading the present disclosure, other variations and modifications will be apparent to persons skilled in the art. Such variations and modifications may involve equivalent and other features which are already known in the art, and which may be used instead of or in addition to features already described herein.

Although claims have been formulated in this application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any claim and whether or not it mitigates any or all of the same technical problems as does the present invention.

Features that are described in the context of separate embodiments may also be provided in combination in a single embodiment. Conversely, various features which are, for brevity, described in the context of a single embodiment, may also be provided separately or in any suitable sub-combination. The applicants hereby give notice that new claims may be formulated to such features and/or combinations of such features during the prosecution of the present Application or of any further application derived there from.

References to an "example," "implementation" or "embodiment" may indicate that the invention so described may include a particular feature, structure, or characteristic, but not every example, implementation or embodiment necessarily includes the particular feature, structure, or characteristic. Further, repeated use of the phrases "in one example," "in one implementation," or "in one embodiment," does not necessarily refer to the same example, implementation or embodiment, although they may.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may be configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

A "computer" may refer to one or more apparatus and/or one or more systems that are capable of accepting a structured input, processing the structured input according to prescribed rules, and producing results of the processing as output. Examples of a computer may include: a computer; a stationary and/or portable computer; a computer having a single processor, multiple processors, or multi-core processors, which may operate in parallel and/or not in parallel; a general purpose computer; a supercomputer; a mainframe; a super mini-computer; a mini-computer; a workstation; a micro-computer; a server; an internet based server (cloud); a web server; a client; an interactive television; a web appliance; a telecommunications device with internet access; a hybrid combination of a computer and an interactive television; a portable computer; a tablet personal computer (PC); a personal digital assistant (PDA); a portable telephone; application-specific hardware to emulate a computer and/or software, such as, for example, a digital signal processor (DSP), a field-programmable gate array (FPGA), an application specific integrated circuit (ASIC), an application specific instruction-set processor (ASIP), a chip, chips, a system on a chip, or a chip set; a data acquisition device; an optical computer; a quantum computer; a biological computer; and generally, an apparatus that may accept data, process data according to one or more stored software programs, generate results, and typically include input, output, storage, arithmetic, logic, and control units.

"Software" may refer to prescribed rules to operate a computer. Examples of software may include: code segments in one or more computer-readable languages; graphical and or/textual instructions; applets; pre-compiled code; interpreted code; compiled code; and computer programs.

A "computer system" may refer to a system having one or more computers, where each computer may include computer-readable medium embodying software to operate the computer or one or more of its components. Examples of a computer system may include: a distributed computer system for processing information via computer systems linked by a network; two or more computer systems connected together via a network for transmitting and/or receiving information between the computer systems; a computer system including two or more processors within a single computer; and one or more apparatuses and/or one or more systems that may accept data, may process data in accordance with one or more stored software programs, may generate results, and typically may include input, output, storage, arithmetic, logic, and control units.

A "network" may refer to a number of computers and associated devices that may be connected by communication facilities. A network may involve permanent connections such as cables or temporary connections such as those made through telephone or other communication links. A network may further include hard-wired connections (e.g., coaxial cable, twisted pair, optical fiber, waveguides, etc.) and/or wireless connections (e.g., radio frequency waveforms, free-space optical waveforms, acoustic waveforms, etc.). Examples of a network may include: an internet, such as the Internet; an intranet; a local area network (LAN); a wide area network (WAN); and a combination of networks, such as an internet and an intranet.

Exemplary networks may operate with any of a number of protocols, such as Internet protocol (IP), asynchronous transfer mode (ATM), and/or synchronous optical network (SONET), user datagram protocol (UDP), IEEE 802.x, etc.

Embodiments of the present invention may include apparatuses for performing the operations disclosed herein. An apparatus may be specially constructed for the desired purposes, or it may comprise a general-purpose device selectively activated or reconfigured by a program stored in the device.

Embodiments of the invention may also be implemented in one or a combination of hardware, firmware, and software. They may be implemented as instructions stored on a machine-readable medium, which may be read and executed by a computing platform to perform the operations described herein.

In the following description and claims, the terms "computer program medium" and "computer readable medium" may be used to generally refer to media such as, but not limited to, removable storage drives, a hard disk installed in hard disk drive, and the like. These computer program products may provide software to a computer system. Embodiments of the invention may be directed to such computer program products.

An algorithm is generally considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, and as may be apparent from the following description and claims, it should be appreciated that throughout the specification descriptions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices. In a similar manner, the term "processor" or "controller" may refer to any device or portion of a device that processes electronic data from registers and/or memory to transform that electronic data into other electronic data that may be stored in registers and/or memory. A "computing platform" may comprise one or more processors.

It will be understood, and is appreciated by persons skilled in the art, that one or more processes, sub-processes, or process steps described in connection with FIGS. 7, 8, 9 and 10 may be performed by hardware and/or software (machine readable instructions). If a server is described (master device may be implemented as a server), the term "server" may mean a combination of hardware and software operating together as a dedicated server or it may mean software executed on a server to implement the approach previously described. If the process is performed by software, the software may reside in software memory (not shown) in a suitable electronic processing component or system such as one or more of the functional components or modules schematically depicted in the figures.

The software in software memory may include an ordered listing of executable instructions for implementing logical functions (that is, "logic" that may be implemented either in digital form such as digital circuitry or source code or in analog form such as analog circuitry or an analog source such an analog electrical, sound or video signal), and may selectively be embodied in any computer-readable medium for use by or in connection with an instruction execution system, apparatus, or device, such as a computer-based system, processor-containing system, or other system that may selectively fetch the instructions from the instruction execution system, apparatus, or device and execute the instructions. In the context of this disclosure, a "computer-readable medium" is any tangible means that may contain or store the program for use by or in connection with the instruction execution system, apparatus, or device. The tangible computer-readable medium may selectively be, for example, but is not limited to, an electronic, magnetic, optical, electromagnetic, infrared, or semiconductor system, apparatus or device. More specific examples, but nonetheless a non-exhaustive list, of tangible computer-readable media would include the following: a portable computer diskette (magnetic), a random access memory (RAM) (electronic), a read-only memory (ROM) (electronic), an erasable programmable read-only memory (EPROM or Flash memory) (electronic) and a portable compact disc read-only memory (CDROM) (optical). Note that the computer-readable medium may even be paper (punch cards or punch tape) or another suitable medium upon which the instructions may be electronically captured, then compiled, interpreted or otherwise processed in a suitable manner if necessary, and stored in a computer memory.

The foregoing detailed description of one or more embodiments of the intruder detection method and system has been presented herein by way of example only and not limitation. It will be recognized that there are advantages to certain individual features and functions described herein that may be obtained without incorporating other features and functions described herein. Moreover, it will be recognized that various alternatives, modifications, variations, or improvements of the above-disclosed embodiments and other features and functions, or alternatives thereof, may be desirably combined into many other different embodiments, systems or applications. Presently unforeseen or unanticipated alternatives, modifications, variations, or improvements therein may be subsequently made by those skilled in the art which are also intended to be encompassed by the appended claims. Therefore, the spirit and scope of any appended claims should not be limited to the description of the embodiments contained herein.

The invention claimed is:

1. A computer-implemented system for purchasing and installing security equipment on a property, the computer implemented system comprising:
   a computer-based purchasing system executed by an at least one processor coupled to a memory for facilitating the purchase of a security system on a property, wherein the computer-based purchasing system presents to a user, a recommended layout for a security system having security system components on an image of a unique geo-coordinate referenced location;
   allows the user to modify the recommended layout and select a final approved layout of security equipment components on the image of the referenced location;
   enables the user to purchase the security equipment components in accordance with the final approved layout;
   associates a unique identification for the purchase of security equipment components on the final approved layout and saves the geo-coordinates for each of the security equipment components based upon the final approved layout; and
   a computer-based installation system for facilitating the installation of the security system, wherein the computer-based installation system:
   retrieves the final approved layout for the purchased security system based upon the unique identification associated with the purchase of security equipment components on the final approved layout;
   presents instructions for installing the purchased security system to the user, where the instructions include displaying an image showing the position of each security equipment component in the security system on the property;
   registers the location where each security equipment component is installed on the property by recording geo-coordinate tag of the equipment component; and
   verifies the proper installation location of each security equipment component by comparing the recorded geo-coordinate tag for each security equipment component with its geo-coordinate in the final approved layout.

2. The computer-implemented system of claim 1, wherein the computer-based purchasing system further allows a change to the number of security system components on the recommended layout of the security system.

3. The computer-implemented system of claim 1, wherein the computer-based purchasing system further allows a change to the type of one or more security system components on the recommended layout of the security system.

4. The computer-implemented system of claim 1, wherein the computer-based installation system further networks the security equipment components and initiates an integrity check on each security equipment component to verify that it is operating correctly.

5. The computer-implemented system of claim 4, wherein the computer-based installation system further programs periodic maintenance for each security equipment component by performing additional integrity checks on each security equipment component at preset time intervals.

6. The computer-implemented system of claim 4, wherein the computer-based installation system further initiates corrective on any security equipment component that fails to pass the integrity check.

* * * * *